(12) United States Patent
Chapman et al.

(10) Patent No.: US 6,875,543 B2
(45) Date of Patent: Apr. 5, 2005

(54) ETCHED-MULTILAYER PHASE SHIFTING MASKS FOR EUV LITHOGRAPHY

(75) Inventors: Henry N. Chapman, Livermore, CA (US); John S. Taylor, Livermore, CA (US)

(73) Assignee: EUV Limited Liability Corporation, Santa Clara, CA (US)

( * ) Notice: Subject to any disclaimer, the term of this patent is extended or adjusted under 35 U.S.C. 154(b) by 27 days.

(21) Appl. No.: 10/256,377

(22) Filed: Sep. 27, 2002

(65) Prior Publication Data

US 2004/0062998 A1 Apr. 1, 2004

(51) Int. Cl.⁷ .............................................. G03F 9/00
(52) U.S. Cl. ....................................................... 430/5
(58) Field of Search ........................... 430/5, 322, 323, 430/324; 716/19, 21

(56) References Cited

U.S. PATENT DOCUMENTS

| | | | |
|---|---|---|---|
| 6,645,679 B1 | * | 11/2003 | La Fontaine et al. .......... 430/5 |
| 2003/0064296 A1 | * | 4/2003 | Yan .............................. 430/5 |

* cited by examiner

*Primary Examiner*—S. Rosasco
(74) *Attorney, Agent, or Firm*—John P. Wooldridge; Alan H. Thompson

(57) ABSTRACT

A method is disclosed for the implementation of phase shifting masks for EUV lithography. The method involves directly etching material away from the multilayer coating of the mask, to cause a refractive phase shift in the mask. By etching into the multilayer (for example, by reactive ion etching), rather than depositing extra material on the top of the multilayer, there will be minimal absorption loss associated with the phase shift.

15 Claims, 2 Drawing Sheets

ETCHED-MULTILAYER PHASE SHIFTING MASKS FOR EUV LITHOGRAPHY

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates to the production of phase shifting masks for extreme ultraviolet lithography (EUVL), and more specifically, it relates to systems and methods for directly writing patterns into the reflective multilayer coating of an extreme ultraviolet lithography phase shifting mask.

2. Description of Related Art

Phase shifting masks give rise to images of much improved contrast as compared with conventional binary masks used in microlithography. In extreme ultraviolet lithography (EUVL), masks are flat substrates with a reflective multilayer coating. Phase-shift EUV masks have been proposed by adding material to the top surface of the multilayer. The material is chosen for its property to phase shift a beam transmitting through it without significantly absorbing. Even so, all materials will absorb, and so the phase shift is accompanied by an undesirable absorption.

The use of phase-shifting masks is a resolution-enhancing technique that is well known in optical microlithography. Its use has also been proposed for EUV lithography. In conventional lithography, where phase shifting is not used, the mask is binary and consists of either reflective or absorbing regions to define the pattern to be printed. The pattern is imaged onto the wafer by the projection optics. For patterns with feature sizes approaching the resolution limit of the projection optics the contrast of the image is much reduced as compared with the contrast (essentially unity) of the mask pattern. The contrast reduction is due somewhat to aberrations of the projection optics, but mostly (in high quality lithographic systems) due to the finite numerical aperture of the projection optics. For example, the aerial image intensity might vary between 0.6 and 0.3 of the bright-field intensity in the bright and dark areas of a pattern, respectively. This would lead to a contrast of 0.3. The low contrast leads to a reduced tolerance to changes in dose or focus in the printing of acceptable patterns into photoresist, or may lead to unacceptable printed patterns even at best dose and focus. The use of phase shifting elements in the mask can dramatically enhance the image contrast. For example, consider a feature on the mask consisting of two adjacent regions that are bright (non-absorbing) such that one region imparts a phase change of π to the reflected beam relative to its neighboring region. The complex amplitude of the reflected beam then varies between 1 and −1. The image of this feature will always pass through zero amplitude (and hence zero intensity) at the boundary of the regions, no matter what aberrations are present in the projection optics. That is, the dark region in the image is zero intensity and so the image contrast will be unity.

Masks for EUV lithography consist of flat multilayer-coated substrates and, in standard operation, are patterned with overlying absorbing features. One method that has been proposed for achieving a phase change on the mask is by adding material to the top of the multilayer. The phase of the light that passes through this material, to be reflected from the multilayer, and traverse the material once more is $4\pi(n-1)t/\lambda$, where n is the refractive index of the material, t is the thickness of material, and $\lambda$ is the wavelength of EUV light. However, the disadvantage of this technique is that, for any material chosen, the required thickness of material to cause the desired π phase shift will also cause absorption of the EUV light. For example, a 42.9 nm thick layer of Mo will cause a π phase shift to the reflected 13.4 nm wavelength beam and a corresponding reduction in reflected intensity by a factor of 0.6.

SUMMARY OF THE INVENTION

It is an object of the present invention to provide a phase shifting mask for EUV lithography by removing material from the multilayer coating of the mask.

This and other objects will be apparent based on the disclosure herein.

The invention is a phase shifting mask for EUV lithography where material is directly etched away from the multilayer coating of the mask, to cause a refractive phase shift in the mask. By etching into the multilayer there will be minimal absorption loss associated with the phase shift.

The phase change is achieved by etching material away from the multilayer. The multilayer structure itself is unchanged below the region that is etched, and so this part of the multilayer is in phase with the multilayer in the unetched region.

To cause a π phase shift, a depth of $h=\lambda/(4(1-n))$ must be etched. The bilayer period of the multilayer is given by $d=\lambda/(2 \sin \theta)$, where θ is the angle of incidence. Therefore, a π phase shift is achieved by etching away $\sin \theta/(2(1-n))$ bilayers.

The desired pattern to be etched into the multilayer can be transferred from a developed resist pattern on the multilayer surface by reactive ion etching. The etch must be controlled to terminate at the correct depth. In production, this would most likely be achieved by controlling the duration of the etch. The precision required in the etch depth is only about one layer depth. The etching procedure can be made compatible with other steps in the processing of the mask.

DETAILED DESCRIPTION OF THE INVENTION

A method is disclosed for the implementation of phase shifting masks for EUV lithography. The method involves directly etching material away from the multilayer coating of the mask, to cause a refractive phase shift in the mask. By etching into the multilayer (for example, by reactive ion etching), rather than depositing extra material on the top of the multilayer as has been previously proposed, there will be minimal absorption loss associated with the phase shift.

Figure 1:
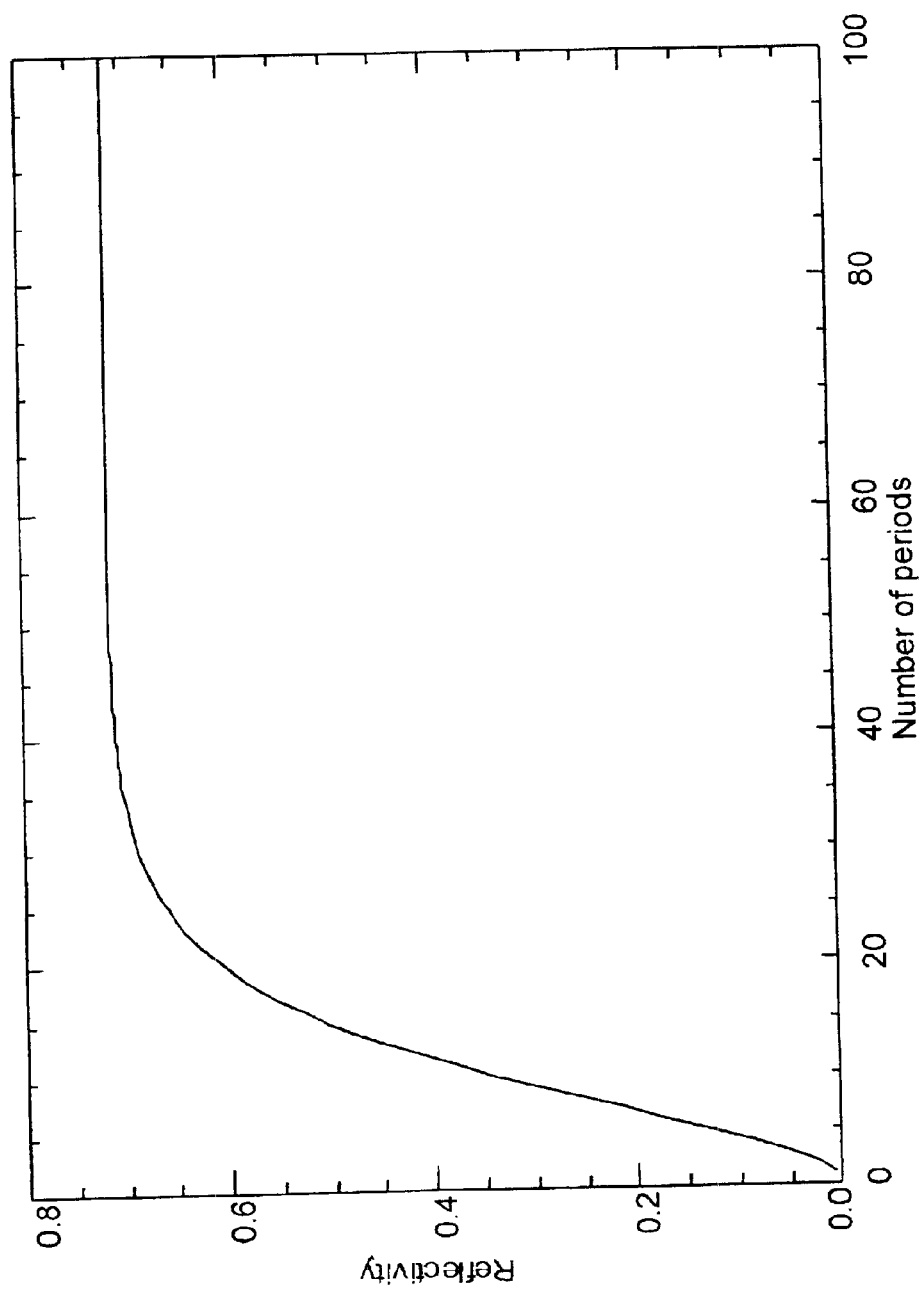
FIG. 1 shows a plot of reflectivity of a MoSi multilayer as a function of the number of layers.
Figure 2:
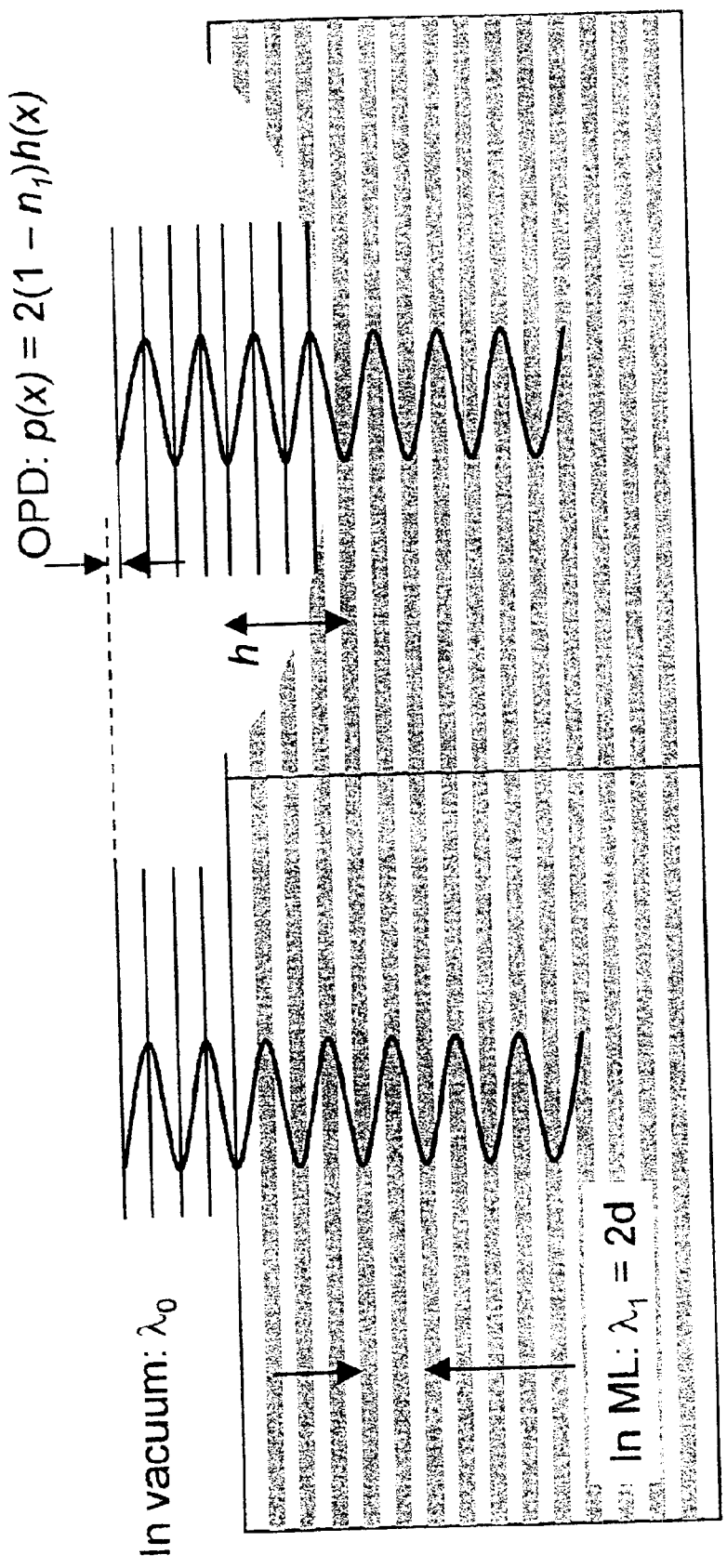
FIG. 2 illustrates EUV light reflecting from the multilayer.

The method for achieving the phase change proposed here is to etch material away from the multilayer. A step of depth h etched into the multilayer will cause a phase change of $4\pi(1-n)h/\lambda$, where n is the average refractive index of the multilayer. Note that the phase change is not the same as a step of depth h in a single-surface mirror, which would be given by $4\pi h/\lambda$. This is because a multilayer reflection is caused by an interference of reflection from all interfaces. The reflectivity is a cooperative effect that occurs through the depth of the multilayer, and the multilayer structure itself pins the phase of the reflected beam. Consider what happens when a step of height h is etched into the top of the multilayer. The multilayer structure itself is unchanged below the region that is etched, and so this part of the multilayer is in phase with the multilayer in the unetched region. The phase of the reflected beam is pinned by the same multilayer structure in both the etched and unetched regions. The only difference is that the incident and reflected waves now travel through a height h of vacuum (of refractive index 1) in the milled region, or a height h of multilayer (of average refractive index n) in the unetched region, before reaching the depth where the multilayer is identical. (EUV systems necessarily operate in vacuum to reduce absorption loss in air.) The difference in the phase of the beam reflecting from the etched region to the beam reflecting from the unetched region is $\phi=4\pi(1-n)h/\lambda$. The structure is quite similar to that where refractive material is added to the multilayer. However, in this case the extra material is multilayer (in the unetched regions), which is in phase with the unperturbed multilayer that covers the entire mask substrate. Even though the extra multilayer material does absorb light, the extra multilayer coherently contributes to the reflectivity. The difference in reflectivity from the etched and non-etched regions depends on the number of layers remaining. FIG. 1 shows a plot of peak reflectivity, at normal incidence, of a MoSi multilayer as a function of the number of layers in the multilayer, for a wavelength of 13.4 nm. The multilayer period is 6.9 nm. FIG. 2 illustrates EUV light reflecting from the multilayer. Outside the multilayer, the difference in path length depends on the difference in refractive indices of the vacuum (n=1) and the multilayer (n1=0.97 for Mo/Si at 13.4 nm wavelength).

To cause a $\pi$ phase shift, a depth of $h=\lambda/(4(1-n))$ must be etched. The bilayer period of the multilayer is given by $d=\lambda/(2\sin\theta)$, where $\theta$ is the angle of incidence. Therefore, a $\pi$ phase shift is achieved by etching away $\sin\theta/(2(1-n))$ bilayers. For example, for a MoSi multilayer at 13.4 nm wavelength, $1-n=0.03$, so for normal incidence, 15 bilayers must be removed. If the initial multilayer has 65 bilayers the etched region will have 50 layers remaining and the reflectivity of these regions will be essentially identical (if terminated in the same way, see below).

The desired pattern to be etched into the multilayer can be transferred from a developed resist pattern on the multilayer surface by reactive ion etching. Such a method has been demonstrated in the manufacture of small pinholes in MoSi multilayers. The etch must be controlled to terminate at the correct depth. In production, this would most likely be achieved by controlling the duration of the etch, but it should be noted that the etch depth can be calibrated very easily. In particular, a signal of ejected electrons, or electron current can be monitored, which reveals which material of the multilayer is currently exposed. By simply counting the layers as they are etched away, the required stop can be determined. Note that the precision required in the etch depth is only about one layer depth.

It is desirable that the etch should be made to terminate at a Si layer. This is because Mo oxidizes to a greater extent than Si, which will cause a reduction in reflectivity. A capping layer could be applied to the etched regions before removing the resist. This capping layer could be identical to the capping layer applied to the original multilayer.

It should be possible to make the etching procedure compatible with other steps in the processing of the mask. That is, the etching step could be done with a reaction ion etcher placed on the mask processing track, and the patterning required prior to etching can be defined in resist using conventional techniques.

Besides the advantage of no reflectance loss as compared with the method of adding material to the mask, the phase shift mask made in the way proposed here may be easier to inspect by visible light means. For the examples given above of MoSi multilayers for 13.4 nm wavelength, the step height in the mask in which Mo is added is 43 nm, compared with a step height of 100 nm for etching. The larger step height will be considerably more visible in a phase-contrast visible-light or DUV inspection microscope.

The foregoing description of the invention has been presented for purposes of illustration and description and is not intended to be exhaustive or to limit the invention to the precise form disclosed. Many modifications and variations are possible in light of the above teaching. The embodiments disclosed were meant only to explain the principles of the invention and its practical application to thereby enable others skilled in the art to best use the invention in various embodiments and with various modifications suited to the particular use contemplated. The scope of the invention is to be defined by the following claims.

We claim:

1. A method for fabricating a phase shifting mask for EUV lithography, wherein said mask comprises a substrate with a reflective multilayer coating attached thereto, the method comprising directly etching material away from said multilayer coating to produce a desired refractive phase shift in said mask, wherein the multilayer coating that was under the portion that was etched away is unchanged, wherein said desired phase change is equal to $4\pi(1-n)h/\lambda$, where h is the mount of material etched from the multilayer, n is the average refractive index of the multilayer and $\lambda$ is the wavelength of light to be reflected.

2. The method of claim 1, wherein the step of directly etching is carried out with an energy source selected from the group consisting of an ion beam, a laser beam, an atomic beam and an electron beam.

3. The method of claim 1, wherein a desired pattern to be etched into the multilayer is transferred from a developed resist pattern on the multilayer surface by reactive ion etching.

4. The method of claim 1, further comprising controlling the etching depth produced by the step of directly etching.

5. The method of claim 4, wherein the step of controlling the etching depth is achieved by controlling the duration of the step of directly etching.

6. The method of claim 4, wherein the step of controlling the etching depth is achieved by monitoring a signal of ejected electrons.

7. The method of claim 4, wherein the step of controlling the etching depth is achieved by monitoring electron current.

8. The method of claim 4, wherein the step of controlling the etching depth is achieved by counting the layers as they are etched away.

9. The method of claim 4, wherein said multilayer coating comprises alternating layers of Molybdenum and Silicon.

10. The method of claim 9, wherein the step of directly etching is terminated at a Si layer.

11. The method of claim 1, further comprising applying a capping layer to the region produced by the step of directly etching.

12. A phase shifting mask for EUV lithography, comprising:
a substrate having a multilayer coating with material removed there from to cause a desired refractive phase shift in said mask, wherein the multilayer coating that was under the portion that was etched away is unchanged, wherein said desired chase change is equal to $4\pi(1-n)h/\lambda$, where h is the mount of material etched from the multilayer, n is the average refractive index of the multilayer and $\lambda$ is the wavelength of light to be reflected.

13. The phase shifting mask of claim 12, wherein said multilayer coating comprises alternating layers of Molebdenum and Silicon.

14. The phase shifting mask of claim 13, wherein the step of directly etching is terminated at a Si layer.

15. The phase shifting mask of claim 12, further comprising a capping layer applied to the etched regions.

* * * * *